United States Patent
Freitag et al.

(10) Patent No.: US 7,900,342 B2
(45) Date of Patent: Mar. 8, 2011

(54) METHODS OF FABRICATING MAGNETORESISTANCE SENSORS PINNED BY AN ETCH INDUCED MAGNETIC ANISOTROPY

(75) Inventors: James M. Freitag, Sunnyvale, CA (US); Mustafa M. Pinarbasi, Morgan Hill, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 901 days.

(21) Appl. No.: 11/678,427

(22) Filed: Feb. 23, 2007

(65) Prior Publication Data

US 2008/0204945 A1 Aug. 28, 2008

(51) Int. Cl.
*G11B 5/127* (2006.01)
*H04R 31/00* (2006.01)

(52) U.S. Cl. ............... 29/603.18; 29/603.07; 29/603.13; 29/603.14; 29/603.15; 29/603.16; 216/62; 216/65; 216/66; 360/324.1; 360/324.11; 360/324.12; 360/324.2

(58) Field of Classification Search ............... 29/603.07, 29/603.13–603.16, 603.18; 216/62, 65, 66; 360/324.1, 324.2, 324.11, 324.12
See application file for complete search history.

(56) References Cited

U.S. PATENT DOCUMENTS

| | | | |
|---|---|---|---|
| 6,169,303 B1 | 1/2001 | Anthony | |
| 6,208,492 B1 * | 3/2001 | Pinarbasi | 360/324.11 |
| 6,785,102 B2 | 8/2004 | Freitag et al. | |
| 6,856,493 B2 | 2/2005 | Pinarbasi | |
| 6,865,062 B2 | 3/2005 | Pinarbasi | |
| 6,960,480 B1 | 11/2005 | Horng et al. | |
| 7,092,219 B2 | 8/2006 | Pinarbasi | |
| 7,189,583 B2 * | 3/2007 | Drewes | 438/3 |
| 7,310,207 B2 * | 12/2007 | Hasegawa et al. | 360/324.11 |
| 7,365,948 B2 * | 4/2008 | Nakabayashi et al. | 360/324.1 |
| 7,564,659 B2 * | 7/2009 | Freitag et al. | 360/324.11 |
| 2003/0161078 A1 | 8/2003 | Pinarbasi et al. | |
| 2005/0047029 A1 | 3/2005 | Noma | |
| 2005/0190509 A1 | 9/2005 | Fox et al. | |
| 2005/0213264 A1 | 9/2005 | Gill | |
| 2005/0237676 A1 | 10/2005 | Gill | |
| 2006/0022227 A1 | 2/2006 | Horng et al. | |
| 2006/0221515 A1 | 10/2006 | Carey et al. | |

OTHER PUBLICATIONS

Pakala et al, Effect of Film Microstructure on Exchange Bias of IrMn/CoFe Films, IEEE Transactions on Magnetics, vol. 36, No. 5, Sep. 2000, pp. 2620-2622, IEEE.

Pakala et al., Effect of underlayer roughness, grain size, and crystal texture on exchange coupled IrMn/CoFe thin films, Journal of Applied Physics, vol. 87, No. 9, May 1, 2000, pp. 6653-6655, American Institute of Physics.

* cited by examiner

*Primary Examiner* — Paul D Kim
(74) *Attorney, Agent, or Firm* — Duft Bornsen & Fishman, LLP

(57) ABSTRACT

Magnetoresistance sensors with magnetic pinned layers that are pinned by anisotropic etch induced magnetic anisotropies and methods for fabricating the magnetoresistance sensors are provided. The method comprises forming a seed layer structure. The seed layer is etched to form an anisotropic etch along a top surface of the seed layer. A magnetic pinned layer is formed on the top surface of the seed layer structure. The anisotropic etch on the top surface of the seed layer structure induces a magnetic anisotropy in the magnetic pinned layer, which pins the magnetization of the magnetic pinned layer structure.

16 Claims, 3 Drawing Sheets

METHODS OF FABRICATING MAGNETORESISTANCE SENSORS PINNED BY AN ETCH INDUCED MAGNETIC ANISOTROPY

BACKGROUND OF THE INVENTION

1. Field of the Invention

The invention is related to the field of magnetic recording head fabrication, and in particular, to improved methods of fabricating a magnetoresistance sensor that is pinned by an etch induced magnetic anisotropy.

2. Statement of the Problem

Magnetic disk drive systems typically include a magnetic disk, a sensor head having a write element and a magnetoresistance (MR) read sensor, a suspension arm, and an actuator arm. As the disk rotates air adjacent to the disk surface moves with the disk. This allows the sensor to fly on an extremely thin cushion of air, generally referred to as an air bearing. When the sensor flies on the air bearing, the actuator arm swings the suspension arm to place the sensor over selected circular tracks on the rotating magnetic disk where signal fields are written to and read by the write and read elements, respectively. The write and read elements are connected to processing circuitry that operates according to a computer program to implement write and read functions.

The most common type of sensors are magnetoresistance (MR) read elements. One type of MR read element is a Giant MR (GMR) read element. GMR read elements may have two layers of ferromagnetic material (e.g., CoFe) separated by a non-magnetic spacer layer (e.g., Cu). These type of GMR read elements are typically referred to as spin valve elements (SV). A simple-pinned SV read element generally includes an anti-ferromagnetic (AMF) pinning layer (e.g., PtMn) which pins a ferromagnetic pinned layer (e.g., CoFe). The ferromagnetic pinned layer has its magnetization fixed by exchange coupling with the AFM pinning layer. The AFM pinning layer generally fixes the magnetic moment of the ferromagnetic pinned layer perpendicular to the air bearing surface (ABS) of the recording head. SV elements further include a non-magnetic spacer layer (e.g., Cu) separating the pinned layer from a ferromagnetic free layer (e.g., CoFe). The magnetization of the ferromagnetic free layer is not fixed and is free to rotate in response to an external magnetic field from the magnetic disk.

Another type of SV read element is an anti-parallel (AP) pinned SV read element. The AP-pinned SV read element differs from the simple pinned SV read element in that an AP-pinned structure has multiple thin film layers forming the pinned layer structure instead of a single pinned layer. The pinned layer structure includes a first ferromagnetic pinned (keeper) layer (e.g., CoFe), a non-magnetic spacer layer (e.g., Ru), and a second ferromagnetic pinned (reference) layer (e.g., CoFe). The first ferromagnetic pinned (keeper) layer has a magnetization oriented in a first direction perpendicular to the ABS by exchange coupling with the AFM pinning layer. The second ferromagnetic pinned (reference) layer is anti-parallel coupled with the first ferromagnetic pinned (keeper) layer across the spacer layer. Accordingly, the magnetization of the second ferromagnetic pinned (reference) layer is oriented in a second direction that is anti-parallel to the direction of the magnetization of the first ferromagnetic pinned (keeper) layer.

Another type of MR read element is a Tunneling MR (TMR) read element. TMR read elements differ from GMR elements in that a thin, electrically insulating, tunnel barrier layer (e.g., aluminum oxide or magnesium oxide) is used between the ferromagnetic pinned layer and the ferromagnetic free layer instead of a non-magnetic spacer layer (e.g., Cu). The TMR read elements may be simple pinned or AP-pinned as with the GMR read elements.

There are several problems with using AFM pinning layers in read sensors. First, including an AFM pinning layer consumes a large fraction of the limited space available in the read gap of the SV read element. As the recording density in magnetic storage devices becomes larger, it is becoming more important to fabricate smaller SV elements. Second, in current perpendicular to plane (CPP) sensors, the current flows through the AFM pinning layer. Because conventional AFM materials have high resistivity, the sensing signal of the SV element is effectively reduced by the parasitic resistance of the AFM layer. It is evident from the above discussion that improved solutions are needed for pinning the magnetic pinned layer in magnetoresistance sensors for high density magnetic recording heads.

SUMMARY OF THE SOLUTION

The invention solves the above and other related problems with improved magnetoresistance sensors with magnetic pinned layers where the magnetization is pinned by an anisotropic etch. A surface of a seed layer or underlayer is etched to form an anisotropic etch. When the magnetic pinned layer is formed over the anisotropic etch, a magnetic anisotropy is formed, which pins the magnetization of the magnetic pinned layer, eliminating the need for the AFM pinning layer. The resulting SV read element fabricated according to the present invention is smaller, and the elimination of the AFM pinning layer also eliminates the parasitic resistance caused by the AFM pinning layer.

A first exemplary embodiment of the invention comprises a method for fabricating a magnetoresistance sensor. A seed layer is etched to form an anisotropic etch along a top surface of the seed layer. A magnetic pinned layer is formed on the top surface of the seed layer. The anisotropic etch on the top surface of the seed layer induces a magnetic anisotropy in the magnetic pinned layer, which pins the magnetization of the magnetic pinned layer structure.

A second exemplary embodiment of the invention comprises a magnetoresistance sensor. The magnetoresistance sensor comprises a seed layer structure with a top surface having an anisotropic etch. The magnetoresistance sensor also comprises a magnetic pinned layer structure formed on the top surface of the seed layer structure having the anisotropic etch. The anisotropic etch induces a magnetic anisotropy in the magnetic pinned layer structure to pin the magnetization of the magnetic pinned layer structure.

A third exemplary embodiment of the invention comprises a method for fabricating a magnetoresistance sensor. The method comprises forming a first seed layer. A second seed layer is formed on the first seed layer. An ion etching process is performed on a top surface of the second seed layer to form an anisotropic etch on the top surface of the seed layer. A magnetic pinned layer structure is formed on the top surface of the second seed layer. A spacer layer is formed on the magnetic pinned layer structure. A free layer is formed on the spacer layer.

The invention may include other exemplary embodiments described below.

DESCRIPTION OF THE DRAWINGS

The same reference number represents the same element or same type of element on all drawings.

DETAILED DESCRIPTION OF THE INVENTION

Figure 1:
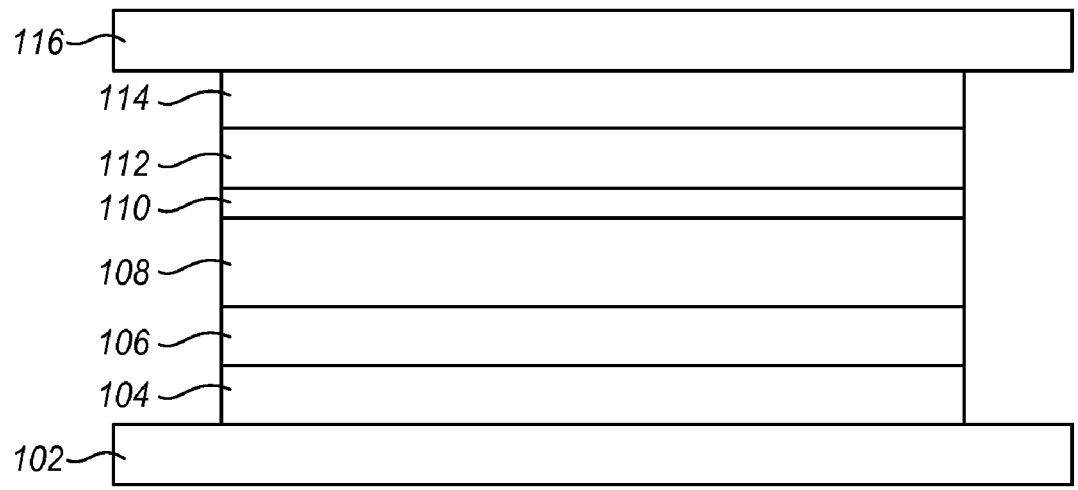
FIG. 1 is a cross sectional view of a prior art magnetoresistance sensor.

FIG. 1 is a schematic illustration of a prior art magnetoresistance sensor (MR) 100. MR sensor 100 includes a shield layer 102 formed on a wafer substrate (not shown). MR sensor 100 also includes one or more seed layers 104 formed on shield layer 102 to facilitate a desired grain structure fabrication of subsequently deposited layers of MR sensor 100. MR sensor 100 also includes an AFM pinning layer 106 formed on seed layer 104. MR sensor 100 also includes a magnetic pinned layer 108 formed on an AFM pinning layer 106. Magnetic pinned layer 108 has its magnetization fixed by exchange coupling with AFM pinning layer 106. A spacer layer 110 is formed on magnetic pinned layer 108. A magnetic free layer 112 is formed on spacer layer 110. The magnetization of magnetic free layer 112 is not fixed and is free to rotate in response to an external magnetic field. A cap layer 114 may be formed on free layer 112 to protect the layers of MR sensor 100 from damage during the fabrication process. A shield layer 116 is formed on cap layer 114.

The size of MR sensor 100 and the number of layers forming MR sensor 100 is a problem for higher density magnetic recording devices. Particularly, the size of AFM pinning layer 106 is a problem, because AFM pinning layer 106 requires a large fraction of the space on MR sensor 100 and causes parasitic resistance in the read signal. The present invention eliminates the size problem of AFM pinning layer 106 and parasitic resistance of AFM pinning layer 106 by eliminating AFM pinning layer 106 from MR sensor 100. Instead, an etch induced magnetic anisotropy pins the magnetization of magnetic pinned layer 108.

FIGS. 2-7 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 2:
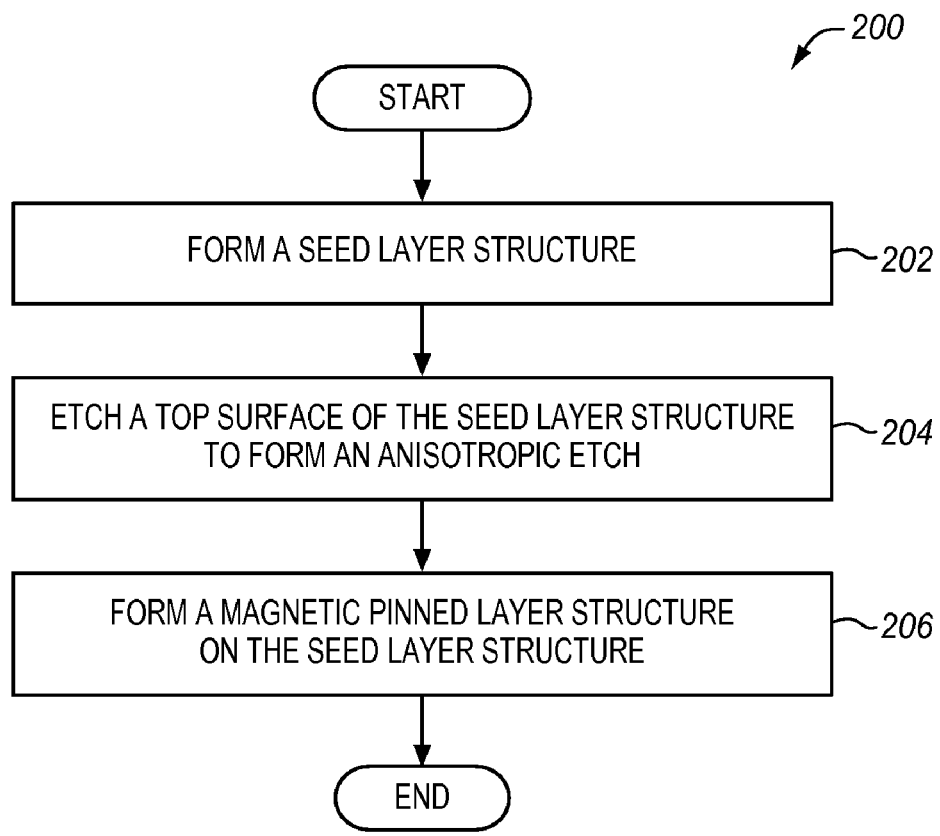
FIG. 2 is a flow chart illustrating an exemplary method for fabricating a magnetoresistance sensor that is pinned with an etch induced magnetic anisotropy.
Figure 3:
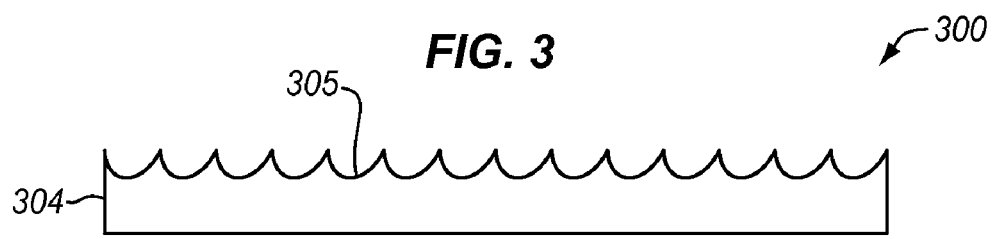
FIGS. 3-4 are cross sectional views of an exemplary magnetoresistance sensor formed according to the method of FIG. 2.
Figure 4:
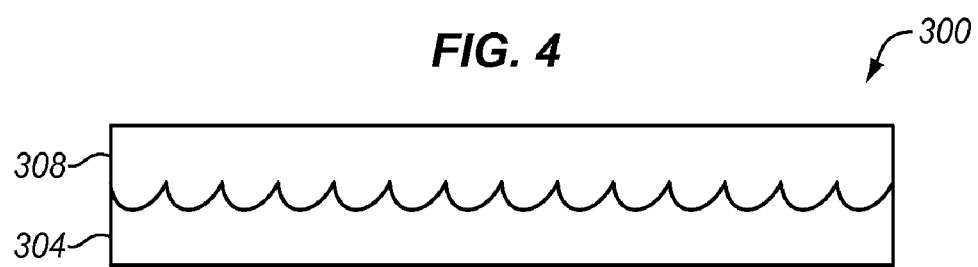

FIG. 2 is a flow chart illustrating an exemplary method 200 for fabricating a magnetoresistance sensor that is pinned with an etch induced magnetic anisotropy. Method 200 will be discussed in reference to magnetoresistance sensor 300 illustrated in FIGS. 3 and 4. The steps of method 200 are not all inclusive, and may include other steps not shown for the sake of brevity of the discussion. Fabrication of magnetic sensor heads is commonly performed at the wafer level, and those skilled in the art understand that wafer level fabrication is assumed even if the description and drawings refer to a single magnetoresistance sensor 300.

In step 202, a seed layer structure 304 (see FIG. 3) is formed upon a shield structure (not shown). Seed layer structure 304 may be formed on other layers, such as a shield layer (not shown) or undercoating of a wafer substrate (not shown). Seed layer structure 304 enhances the magnetic anisotropy of subsequently deposited magnetic layers and facilitates a desired grain structure fabrication of subsequently deposited layers of magnetoresistance sensor 300. Seed layer structure 304 may comprise one or more layers. For instance, seed layer structure 304 may comprise Tantalum (Ta) or Ruthenium (Ru) in one embodiment.

In step 204, a top surface 305 of seed layer structure 304 is etched to form an anisotropic etch. An anisotropic etch is an etch of unequal physical properties along different axes of the etched surface. The etching process may be performed using an ion etching process. The anisotropic etch forms an anisotropic roughness on top surface 305 of seed layer structure 304. The anisotropic roughness may be in the form of oriented ripples or facets formed by the etching process which induces a magnetic uniaxial anisotropy in subsequently deposited layers in a direction substantially perpendicular or canted to the ABS.

In step 206, a magnetic pinned layer structure 308 (see FIG. 4) is formed on top surface 305 of seed layer structure 304. The anisotropic etch induces a magnetic anisotropy in magnetic pinned layer structure 308, which pins the magnetization of magnetic pinned layer structure 308. The pinning effect of the magnetic anisotropy eliminates the need for an AFM pinning layer (e.g., AFM pinning layer 106 of FIG. 1). As a result, a smaller sized MR sensor 300 is fabricated.

Figure 5:
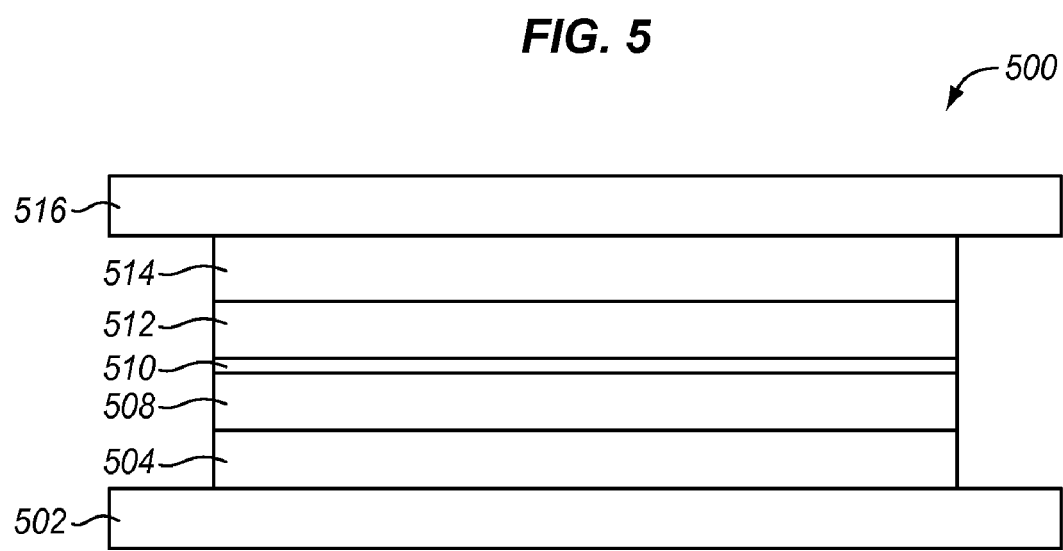
FIG. 5 is a cross sectional view of another exemplary magnetoresistance sensor.

FIG. 5 is a schematic illustration of an exemplary MR sensor 500 incorporating a seed layer structure 504 and a magnetic pinned layer 508 fabricated according to method 200. A first shield layer 502 is formed on a wafer substrate (not shown). Seed layer structure 504 is formed on first shield layer 502. For example, seed layer structure 504 may comprise a first layer of Ta (30 Angstroms thick) and a second layer of Ru (60 Angstroms thick). The top surface of seed layer 504 has an anisotropic etch, and magnetic pinned layer 508 is formed on the top surface of seed layer 504. Magnetic pinned layer structure 508 may be a simple, single pinned layer. Magnetic pinned layer structure 508 may also be an anti-parallel (AP) pinned structure. Magnetic pinned structure 508 may be formed of one or more layers of materials such as Co, CoFe, or other soft magnetic materials. A spacer layer 510 is formed on magnetic pinned layer 508.

A magnetic free layer 512 is formed on spacer layer 510. Magnetic free layer 512 may be formed of one or more layers of materials. Exemplary materials may include NiFe, Co, CoFe or any other soft magnetic material. Magnetic free layer 512 is free to rotate in the presence of an external magnetic field. A cap layer 514 is formed on magnetic free layer 512 to protect the other layers of MR sensor 500 from damage during manufacture. Cap layer 514 may comprise Ta. A second shield layer 516 is formed on cap layer 514.

MR sensor 500 may be a CPP GMR or a CPP TMR sensor. In CPP GMR sensors, magnetic free layer 512 and magnetic pinned layer 508 are separated by a non-magnetic, electrically conductive spacer layer 510. Spacer layer 510 may comprise a material such as Cu. In CPP TMR sensors, magnetic free layer 512 and magnetic pinned layer 508 are separated by a non-magnetic, electrically insulating barrier layer 510. The electrically insulating barrier layer 510 may comprise a material such as Aluminum Oxide ($Al_2O_3$).

Figure 6:
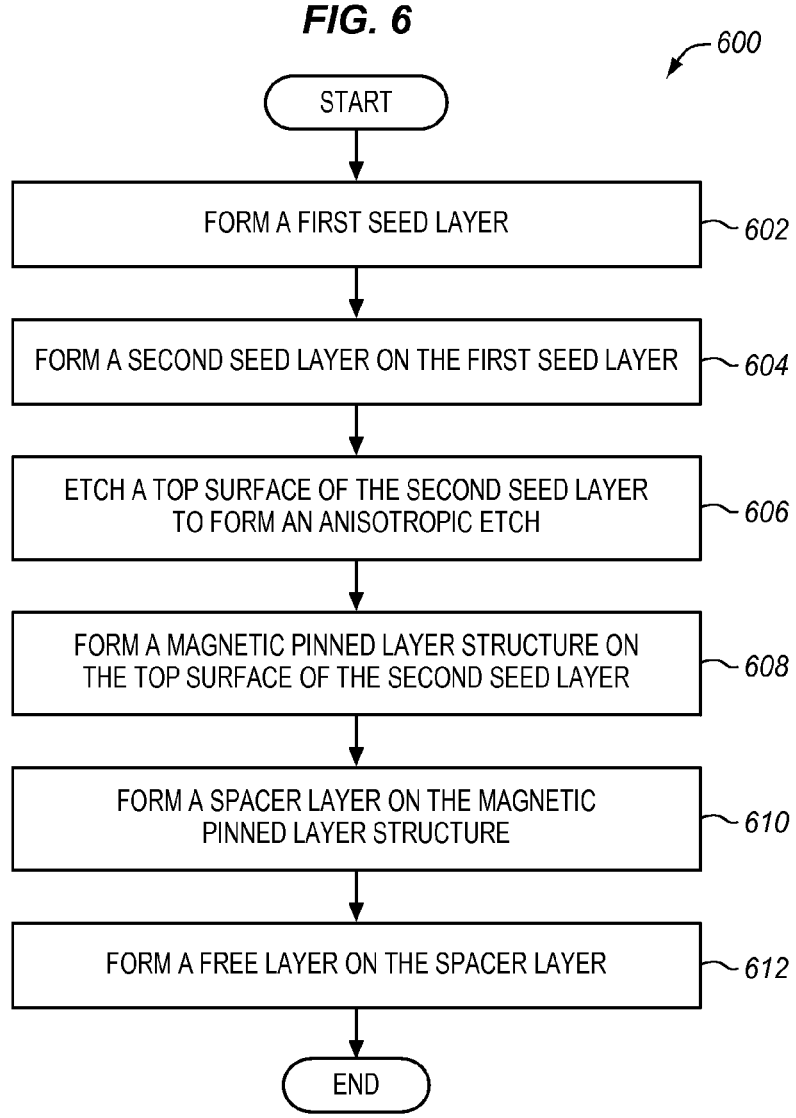
FIG. 6 is a flow chart illustrating another exemplary method for fabricating a magnetoresistance sensor that is pinned with an etch induced magnetic anisotropy.
Figure 7:
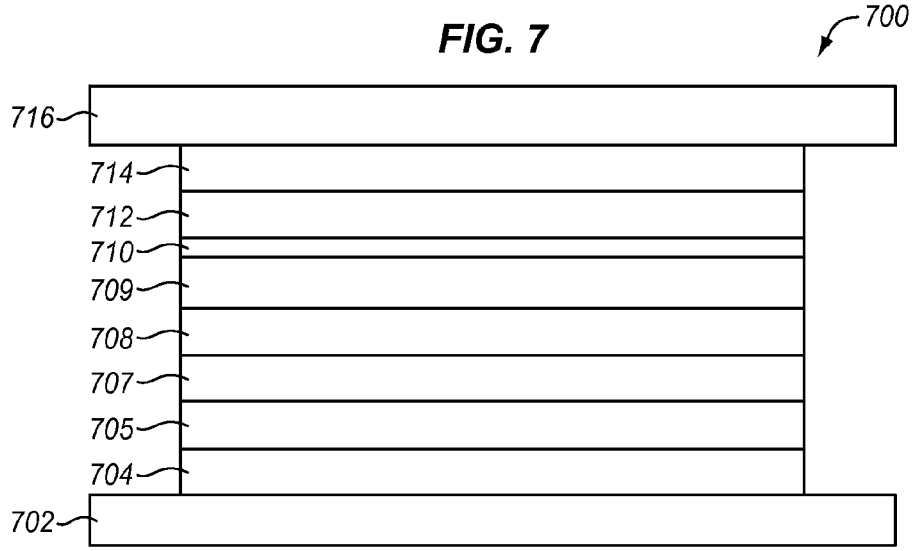
FIG. 7 is a cross sectional view of another exemplary magnetoresistance sensor.

FIG. 6 is a flow chart illustrating an exemplary method 600 for fabricating a magnetoresistance sensor that is pinned with an etch induced magnetic anisotropy. Method 600 will be discussed in reference to MR sensor 700 illustrated in FIG. 7. The steps of method 600 are not all inclusive, and may include other steps not shown for the sake of brevity.

In step 602, a first seed layer 704 is formed on a shield layer 702. Shield layer 702 is formed on a wafer substrate or wafer undercoating layer (not shown). In step 604, a second seed layer 705 is formed on first seed layer 704. First seed layer 704 and second seed layer 705 may be any materials selected to enhance the magnetic anisotropy of subsequently deposited layers and facilitate the desired grain structure fabrication of subsequently deposited layers of magnetoresistance sensor 700. The first and second seed layers may comprise materials having a body centered cubic (BCC) structure or a hexagonal closest packed (HCP) structure. For example, the first seed layer may be a material such as Ta, and the second seed layer may be a material such as Ru.

In step 606, a top surface of second seed layer 705 is etched to form an anisotropic etch. The etching process is performed using an ion etching beam at an angle Θ with respect to normal of the top surface of second seed layer 705. The ion beam may have a voltage of less than 100 volts and an angle of between 30 degrees and 60 degrees with respect to normal of seed layer structure 705. An etching time for removal of between 5 Angstroms and 100 Angstroms of seed layer material may be used. This corresponds to an etching process performed for between 50 seconds and 1000 seconds. For example, the etching process may be performed with a 50 V beam, 60 degrees from normal for 600 seconds.

In step 608, a magnetic pinned layer structure is formed on the top surface of second seed layer 705. A first AP magnetic pinned layer 707 is formed on the top surface of second seed layer 705. A spacer layer 708 is formed on first AP magnetic pinned layer 707. Spacer layer 708 may comprise a Ru layer. A second AP magnetic pinned layer 709 is formed on spacer layer 708.

In step 610, a spacer layer 710 is formed on second AP magnetic pinned layer 709. The spacer layer 710 may comprise a Cu layer. In step 612, a magnetic free layer 712 is formed on spacer layer 710. A shield layer 714 may then be formed on magnetic free layer 712.

The elimination of the AFM pinning layer reduces the size of MR sensor 700. As a result, MR sensor 700 is smaller than conventional MR sensors having an AFM pinning layer. The elimination of the AFM pinning layer also eliminates the parasitic resistance caused by the AFM pinning layer. As a result, MR sensor 700 operates more effectively than conventional MR sensors.

Although specific embodiments were described herein, the scope of the invention is not limited to those specific embodiments. The scope of the invention is defined by the following claims and any equivalents therein.

We claim:

1. A method for fabricating a magnetoresistance sensor, the method comprising:
    forming a seed layer structure;
    etching a top surface of the seed layer structure to form an anisotropic etch on the top surface of the seed layer structure; and
    forming a magnetic pinned layer structure on the seed layer structure, wherein the anisotropic etch induces a magnetic anisotropy in the magnetic pinned layer structure to pin the magnetization of the magnetic pinned layer structure.

2. The method of claim 1 further comprising:
    forming a non-magnetic electrically insulating barrier layer on the magnetic pinned layer structure; and
    forming a free layer on the barrier layer.

3. The method of claim 1 further comprising:
    forming a non-magnetic electrically conductive spacer layer on the magnetic pinned layer structure; and
    forming a free layer on the spacer layer.

4. The method of claim 1 wherein forming the magnetic pinned layer structure comprises:
    forming a first anti-parallel magnetic pinned layer on the top surface of the seed layer structure having the anisotropic etch;
    forming a spacer layer on the first anti-parallel magnetic pinned layer; and
    forming a second anti-parallel magnetic pinned layer on the spacer layer.

5. The method of claim 1 wherein forming the seed layer structure comprises:
    forming a Tantalum (Ta) layer; and
    forming a Ruthenium (Ru) layer on the Ta layer.

6. The method of claim 5 wherein etching a top surface of the seed layer structure comprises etching the Ru layer.

7. The method of claim 1 wherein the seed layer structure comprises a material having a body centered cubic (BCC) structure.

8. The method of claim 1 wherein the seed layer structure comprises a material having a hexagonal closest packed (HCP) structure.

9. The method of claim 1 wherein etching the top surface of the seed layer structure comprises:
    etching the top surface of the seed layer structure using an ion etching process.

10. The method of claim 9 wherein etching the top surface of the seed layer structure comprises:
    etching the top surface of the seed layer structure using an ion beam with a voltage of less than about 100 volts.

11. The method of claim 9 wherein etching the top surface of the seed layer structure comprises:
    etching the top surface of the seed layer structure using an ion beam at an angle between about 30 degrees and about 80 degrees from normal.

12. The method of claim 9 wherein etching the top surface of the seed layer structure comprises:
    etching the top surface of the seed layer structure using an ion beam for a time between about 50 seconds and about 1000 seconds.

13. A method for fabricating a magnetoresistance sensor, the method comprising:
    forming a first seed layer;
    forming a second seed layer on the first seed layer;
    etching a top surface of the second seed layer with an ion etching process to form an anisotropic etch on the top surface of the second seed layer;
    forming a magnetic pinned layer structure on the top surface of the second seed layer, wherein the anisotropic etch induces a magnetic anisotropy in the magnetic pinned layer structure to pin the magnetization of the magnetic pinned layer structure;
    forming a spacer layer on the magnetic pinned layer structure; and
    forming a free layer on the spacer layer.

14. The method of claim 13 wherein forming the magnetic pinned layer structure comprises:
    forming a first anti-parallel magnetic pinned layer on the top surface of the second seed layer;

forming a spacer layer on the first anti-parallel magnetic pinned layer; and forming a second anti-parallel magnetic pinned layer on the spacer layer.

15. The method of claim 13 wherein the first seed layer comprises Tantalum (Ta) and the second seed layer comprises Ruthenium (Ru).

16. The method of claim 13 wherein etching the top surface of the second seed layer comprises:

etching the second seed layer with an ion beam having a voltage of less than about 100 volts, and an angle between about 30 degrees and about 80 degrees from normal of the second seed layer.

* * * * *